(12) United States Patent
Jinno et al.

(10) Patent No.: US 7,033,872 B2
(45) Date of Patent: Apr. 25, 2006

(54) THIN FILM TRANSISTOR AND METHOD OF FABRICATING THE SAME

(75) Inventors: Yushi Jinno, Gifu-ken (JP); Ken Wakita, Gifu-ken (JP); Masahiro Minegishi, Tokyo (JP)

(73) Assignees: Sanyo Electric., Ltd., Osaka (JP); Sony Corporation, Tokyo (JP)

( * ) Notice: Subject to any disclaimer, the term of this patent is extended or adjusted under 35 U.S.C. 154(b) by 0 days.

(21) Appl. No.: 10/884,500

(22) Filed: Jul. 1, 2004

(65) Prior Publication Data

US 2004/0241925 A1    Dec. 2, 2004

Related U.S. Application Data

(62) Division of application No. 09/753,397, filed on Jan. 3, 2001, which is a division of application No. 08/997,763, filed on Dec. 24, 1997, now Pat. No. 6,207,971.

(30) Foreign Application Priority Data

Dec. 27, 1996  (JP)  ................................ 8-350619

(51) Int. Cl.
*H01L 21/00*  (2006.01)

(52) U.S. Cl. ....................... 438/166; 438/487

(58) Field of Classification Search .................. 438/30, 438/150, 166, 197, 308, 487
See application file for complete search history.

(56) References Cited

U.S. PATENT DOCUMENTS

| | | | |
|---|---|---|---|
| 4,975,760 A | 12/1990 | Dohjo et al. | |
| 5,231,297 A | 7/1993 | Nakayama et al. | 257/77 |
| RE34,658 E | 7/1994 | Yamazaki et al. | 257/53 |
| 5,466,619 A | 11/1995 | Choi | 437/41 |
| 5,498,904 A | 3/1996 | Harata et al. | 257/62 |
| 5,529,951 A * | 6/1996 | Noguchi et al. | 438/487 |
| 5,548,132 A * | 8/1996 | Batra et al. | 257/66 |
| 5,610,737 A | 3/1997 | Akiyama et al. | 349/47 |
| 5,733,793 A | 3/1998 | Song et al. | 437/40 |
| 5,744,824 A | 4/1998 | Kousai et al. | 257/74 |
| 5,773,329 A | 6/1998 | Kuo | 438/162 |

(Continued)

FOREIGN PATENT DOCUMENTS

JP   36273660   4/1987

(Continued)

OTHER PUBLICATIONS

Serikawa et al., "Low-Temperature Fabrication of High-Mobility Poly-Si TFT's for Large-Area LCD's" *IEEE Transactions on Electron Devices*, 36(9) 1989.

*Primary Examiner*—David Vu
(74) *Attorney, Agent, or Firm*—Sheridan Ross P.C.

(57) ABSTRACT

A thin film transistor which can be used in an LCD display panel includes an insulator substrate, a gate electrode located on the insulator substrate, an insulator film provided on the insulator substrate and the gate electrode, and a polycrystalline silicon film located on the insulator film. A channel is defined in a first portion of the polycrystalline silicon film over the gate electrode, and a drain and a source are defined in second and third portions of the polycrystalline silicon film over the insulator substrate. Grain sizes of the drain and source are equal to or greater than a grain size of the channel.

4 Claims, 6 Drawing Sheets

U.S. PATENT DOCUMENTS

| | | | |
|---|---|---|---|
| 5,811,327 A * | 9/1998 | Funai et al. | 438/166 |
| 5,834,797 A | 11/1998 | Yamanaka | 257/57 |
| 5,858,820 A | 1/1999 | Jung et al. | 438/150 |
| 5,946,562 A | 8/1999 | Kuo | 438/166 |
| 6,130,120 A | 10/2000 | Park | 438/166 |
| 6,403,497 B1 * | 6/2002 | Oka et al. | 438/770 |

FOREIGN PATENT DOCUMENTS

| | | |
|---|---|---|
| JP | 4-139728 | 5/1992 |
| JP | 5067782 | 3/1993 |
| JP | 5082550 | 4/1993 |

* cited by examiner

THIN FILM TRANSISTOR AND METHOD OF FABRICATING THE SAME

CROSS REFERENCE TO RELATED APPLICATIONS

This patent application is a divisional of prior U.S. patent application Ser. No. 09/753,397, filed Jan. 3, 2001, which is a divisional of Ser. No. 08/997,763, filed Dec. 24, 1997, now U.S. Pat. No. 6,207,971, issued Mar. 27, 2001, which claims foreign priority benefits under 35 U.S.C. §119 from Japanese Patent Application Ser. No. 8-350619 filed Dec. 27, 1996, the disclosures of which are hereby incorporated herein by reference in their entirety.

BACKGROUND OF THE INVENTION

The present invention relates to a thin film transistor suitable for use in an active matrix type display apparatus and a method of fabricating the same.

A liquid crystal display (LCD) of an active matrix type which uses thin film transistors (TFTs) has recently been getting attention as a high-quality display apparatus. Dot matrix type LCDs, which have a plurality of pixels arranged in a matrix form, are generally classified into a simple matrix system and an active matrix system.

The active matrix type LCD includes pixels, pixel drive elements (active elements) and signal storage elements (storage capacitors or added capacitors) and drives a liquid crystal in a quasi-static manner which permits each pixel to store data. Each pixel drive element serves as a switch which is switched on or off in response to a scan signal. When the pixel drive element is enabled, a data signal (display signal) is transmitted via that pixel drive element to the associated display electrode, such that the liquid crystal is driven by the data signal. When the pixel drive element is disabled, the data signal is stored in the form of a charge in the associated signal storage element. The liquid crystal is kept driven by the discharging of the charge until the pixel drive element is switched on again. Even though the drive time assigned to a single pixel decreases as the number of scan lines increases, the liquid crystal is sufficiently driven. This prevents the contrast from becoming lower.

Thin film transistors (TFTs) are generally used as pixel drive elements. A TFT has an active layer comprised of a thin semiconductor film formed on an insulator substrate. The semiconductor film preferably includes an amorphous silicon film or a polycrystalline silicon film. A TFT having an active layer comprised of an amorphous silicon film is called an amorphous silicon TFT, while a TFT having an active layer comprised of a polycrystalline silicon film is called a polycrystalline silicon TFT. The polycrystalline silicon TFT has a greater field effect mobility and higher drive performance than the amorphous silicon TFT. Because of these advantages, the polycrystalline silicon TFT can be used as a logic circuit element as well as a pixel drive element. The use of polycrystalline silicon TFTs, therefore, allows not only the display screen, but also a peripheral drive circuit, located at the periphery of the display screen, to be integrally formed on the same substrate. That is, the display screen and peripheral drive circuit can be formed in the same step.

FIG. 1 is a schematic block diagram of a typical active matrix type LCD. The LCD includes a display panel 101, a gate driver 103, and a drain (data) driver 104. The display panel 101 has a plurality of scan lines (gate lines) G1, . . . , Gn, Gn+1, . . . , and Gm, a plurality of data lines (drain lines) D1, . . . , Dn, Dn+1, . . . , and Dm running perpendicular to the gate lines G1 to Gm, and a plurality of pixels 102 provided at the intersections of the gate lines G1 to Gm and the drain lines D1 to Dm. The gate driver 103, connected to the gate lines G1 to Gm, applies a gate signal (scan signal) to the gate lines G1 to Gm. The drain driver 104, connected to the drain lines D1 to Dm, applies a data signal (video signal) the drain lines D1 to Dm. Both drivers 103 and 104 form a peripheral drive circuit 105. Either one of the drivers 103 and 104 or both are preferably formed on the same substrate on which the display panel 101 is formed. The LCD is generally called a driver-integrated (driver-incorporated) LCD. The gate driver 103 or the drain driver 104 may be provided on both sides of the display panel 101.

FIG. 2 shows an equivalent circuit of each pixel 102. The pixel 102 includes a liquid crystal (LC) cell LC having a display electrode (pixel electrode) and a common electrode. The LC cell LC is connected to both a TFT 106 and a supplemental capacitor $C_S$ which has a storage electrode and an opposing electrode. The TFT 106 has a gate connected to the gate line Gn, a drain connected to the drain line Dn, and a source connected to the display electrode of the LC cell LC and the storage electrode of the supplemental capacitor $C_S$. The LC cell LC and the supplemental capacitor $C_S$ form a signal storage element. A voltage $V_{com}$ is applied to the common electrode of the LC cell LC. A predetermined voltage signal $V_R$ is applied to the opposing electrode of the supplemental capacitor $C_S$. The common electrode of the LC cell LC is common to all the pixels 102. The LC cell LC has a capacitor formed between the display electrode and the common electrode.

The writing characteristic and holding characteristic of the pixel 102 are important in improving the image quality. The writing characteristic shows how much the LC cell LC and the supplemental capacitor $C_S$ can write desired video signals per unit time based on the specifications of the display panel 101. The holding characteristic shows how long the written video signals can be held. The supplemental capacitor $C_S$ is provided to increase the capacitance of the pixel to improve the holding characteristic. In other words, the supplemental capacitor $C_S$ supplements the LC cell LC with the capacitance.

When a positive voltage is applied to the gate of the TFT 106 via the gate line Gn, the TFT 106 is turned on and a data signal is applied to the drain line Dn. As a result, the capacitor of the LC cell LC and the supplemental capacitor $C_S$ are charged. If a negative voltage is applied to the gate of the TFT 106, the TFT 106 is turned off. At this time, the capacitor of the LC cell LC and the supplemental capacitor $C_S$ hold the applied voltage. In other words, the pixel 102 holds a data signal as the data signal is applied to the associated one of the drain lines D1 to Dm by controlling the voltage on the associated one of the gate line to G1 to Gm. An image is displayed on the display panel 101 in accordance with the held data signal.

FIG. 3 is a cross-sectional view of a part of the conventional LCD display panel 101 which has polycrystalline silicon TFTs 106 of a bottom gate structure. It is preferable that the display panel 101 is of a transparent type.

A polycrystalline silicon film (active layer) 81 of the TFT 106 is formed as follows. First, an amorphous silicon film is formed on a gate insulator film 80 using CVD (Chemical Vapor Deposition). The gate insulator film 80 preferably includes a silicon nitride film 78 and a silicon oxide film 79. Next, an excimer laser beam is irradiated on the surface of the amorphous silicon film to heat the amorphous silicon film, thus forming a polycrystalline silicon film. Laser annealing using an excimer laser beam is called ELA (Excimer Laser Anneal). The ELA scans with a line beam to anneal the entire surface of the amorphous silicon film.

It is preferable that chromium with a high thermal conductivity is used for the gate electrode, 76, of the TFT 106 and the opposing electrode, 77, of the supplemental capacitor $C_S$. Therefore, the heat energy applied to a part of the amorphous silicon on the gate electrode 76 by the ELA is transmitted via the associated one of the gate lines G1 to Gn, integral with the gate electrode 76, and is diffused outside the irradiation area of the line beam. Consequently, the temperature of the part of the amorphous silicon film on the gate electrode 76 is lower than that of another portion of the amorphous silicon film. In other words, the energy provided to a part of the amorphous silicon film on the gate electrode 76 is lower than the energy given to another part of the amorphous silicon film above the insulator substrate 71. It is preferable to set the laser energy to maximize the grain size of the polycrystalline silicon film 81. When the laser energy exceeds the value that maximizes the grain size, the grain size becomes drastically smaller. Suppose that the laser energy has been set so that the grain size of a channel region 93, defined by a part of the polycrystalline silicon film 81 on the gate electrode 76, becomes maximum. In this case, larger energy than that on the channel region 93 is applied to another part of the polycrystalline silicon film 81. A drain region 82 and a source region 83 are defined in the other part. Accordingly, the grain sizes of the drain region 82 and the source region 83 become smaller. The drain region 82 preferably includes a low-concentration region 82a and a high-concentration region 82b. The source region 83 preferably includes a low-concentration region 83a and a high-concentration region 83b.

FIG. 4 is a graph showing a relationship between the grain sizes of the drain and source regions 82 and 83 and the sheet resistances of both regions 82 and 83 and a relationship between the grain size and the ON current of the TFT 106.

As the grain sizes of the drain and source regions 82 and 83 become smaller, the sheet resistances of the drain and source regions 82 and 83 increase and the ON current of the TFT 106 drops. This is because the sheet resistances of the drain and source regions 82 and 83 serve as a parasitic resistance to reduce the ON current of the TFT 106.

If the ON currents of more than a certain number of TFTs 106 drop to or below a desired value, the display panel 101 becomes defective. Further, if the ON currents of some TFTs 106 drop to or below the desired value, blurring occurs on the display image on the display panel 101. The dropping of the ON currents of the TFTs thus reduces the yield of the display panel 101 and causes a display failure.

Accordingly, it is an object of the present invention to provide a thin film transistor which prevents the ON current from dropping due to a variation in the grain sizes of drain and source regions, and a method which accomplishes the prevention.

SUMMARY OF THE INVENTION

Briefly stated, the present invention provides a method of fabricating a thin film transistor. The method includes the steps of: forming a gate electrode on an insulator substrate; forming a gate insulator film over the insulator substrate and the gate electrode; forming an amorphous silicon film on the gate insulator film; irradiating laser light on a surface of the amorphous silicon film to heat the amorphous silicon film, thereby forming a polycrystalline silicon film; and setting energy of the laser light such that a grain size of a first portion of the polycrystalline silicon film over the insulator substrate becomes equal to or greater than a grain size of a second portion of the polycrystalline silicon film over the gate electrode.

The present invention further provides a thin film transistor having an active layer. The active layer includes a polycrystalline silicon film where a drain, a source and a channel are defined. Grain sizes of the drain and source are equal to or greater than a grain size of the channel.

The present invention provides a thin film transistor including: an insulator substrate; a gate electrode located on the insulator substrate; an insulator film provided on the insulator substrate and the gate electrode; and a polycrystalline silicon film located on the insulator film. A channel is defined in a first portion of the polycrystalline silicon film over the gate electrode, and a drain and a source are defined in second and third portions of the polycrystalline silicon film over the insulator substrate. Grain sizes of the drain and source are equal to or greater than a grain size of the channel.

The present invention further provides an active matrix type display apparatus including: a plurality of pixels; and a plurality of drive elements for respectively driving the plurality of pixels, each drive element including a thin film transistor. The thin film transistor having: an insulator substrate; a gate electrode located on the insulator substrate; an insulator film provided on the insulator substrate and the gate electrode; and a polycrystalline silicon film located on the insulator film. A channel is defined in a first portion of the polycrystalline silicon film over the gate electrode, and a drain and a source are defined in second and third portions of the polycrystalline silicon film over the insulator substrate. Grain sizes of the drain and source are equal to or greater than a grain size of the channel.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, will be better understood by reference to the following description of the presently preferred embodiment together with the accompanying drawings, in which.

DETAILED DESCRIPTION OF THE PREFERRED EMBODIMENTS

Figure 1:
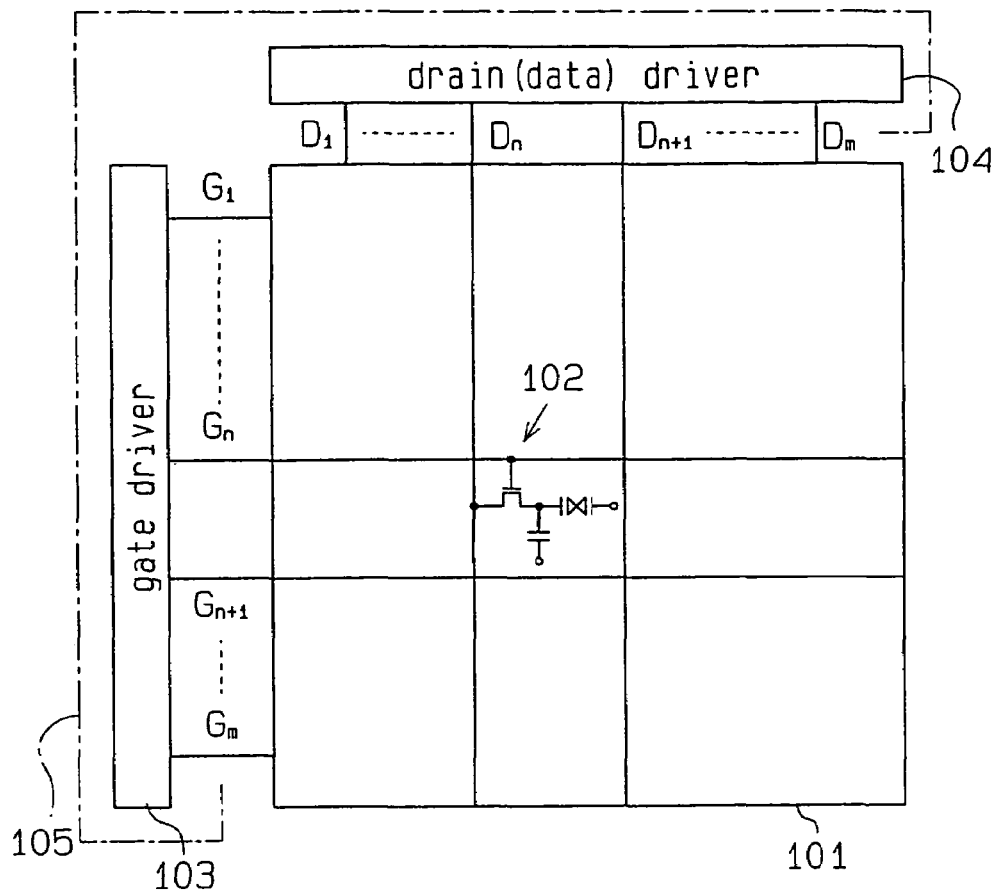
FIG. 1 is a schematic block diagram of a conventional LCD of the active matrix type.
Figure 2:
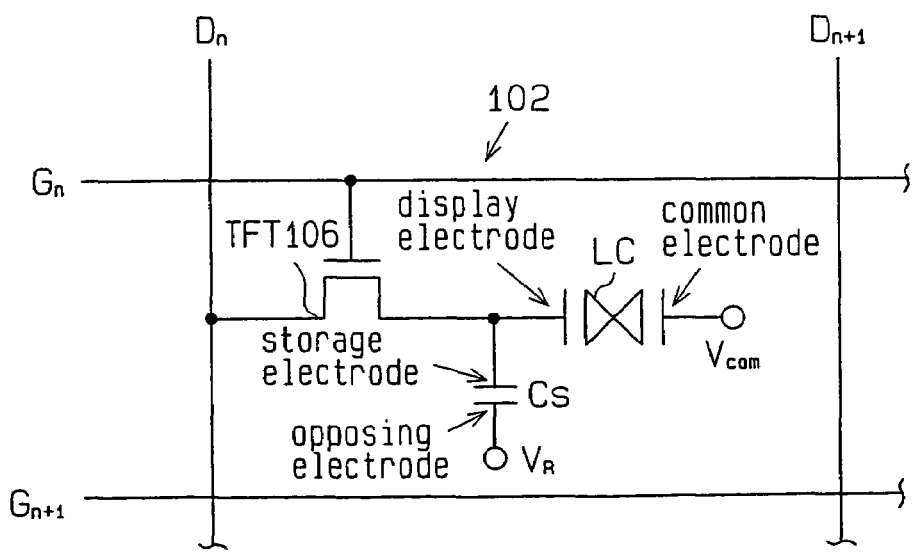
FIG. 2 is an equivalent circuit diagram of a pixel in an LCD display panel.
Figure 3:
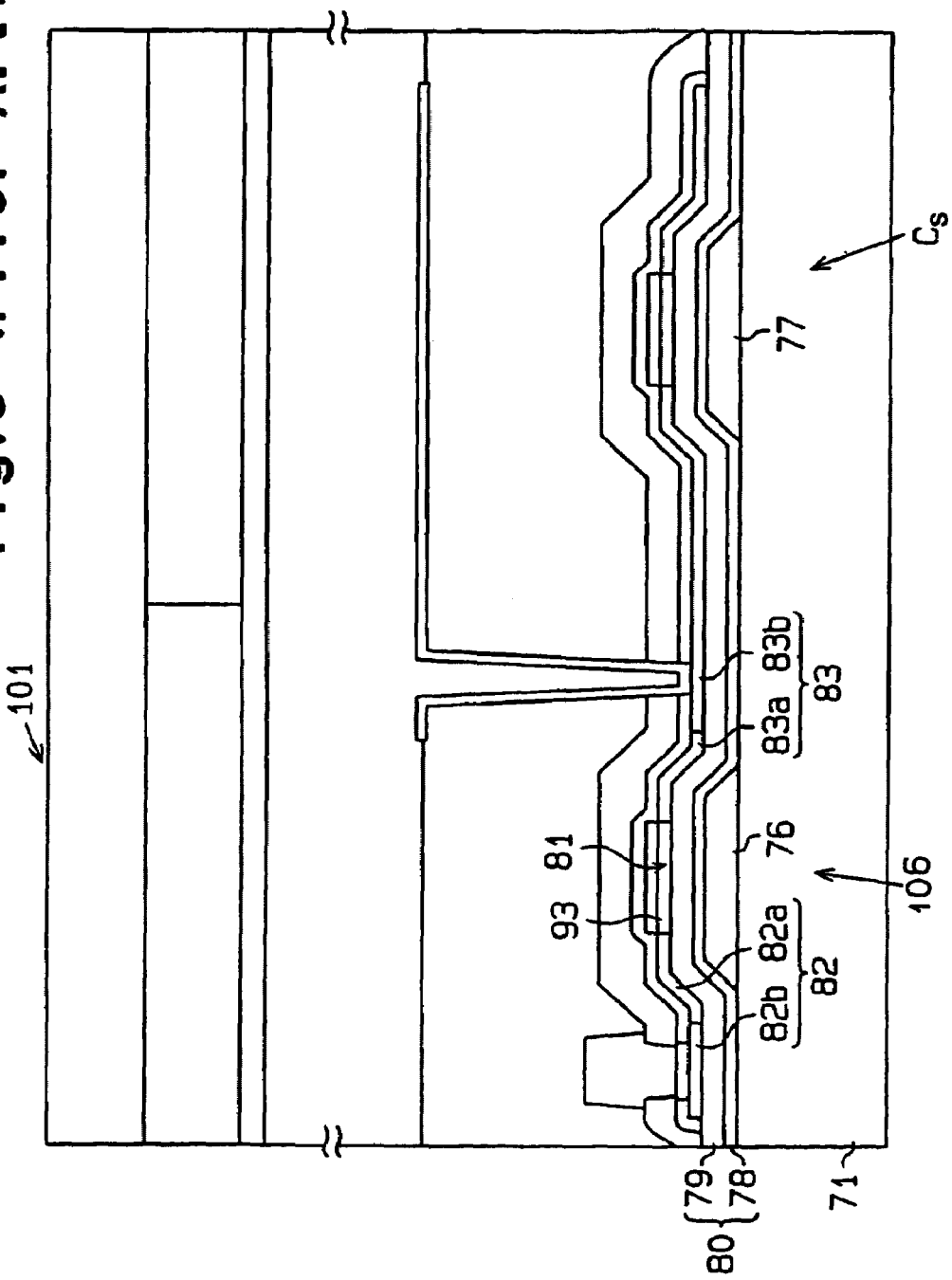
FIG. 3 is a cross-sectional view of a part of conventional display panel.
Figure 4:
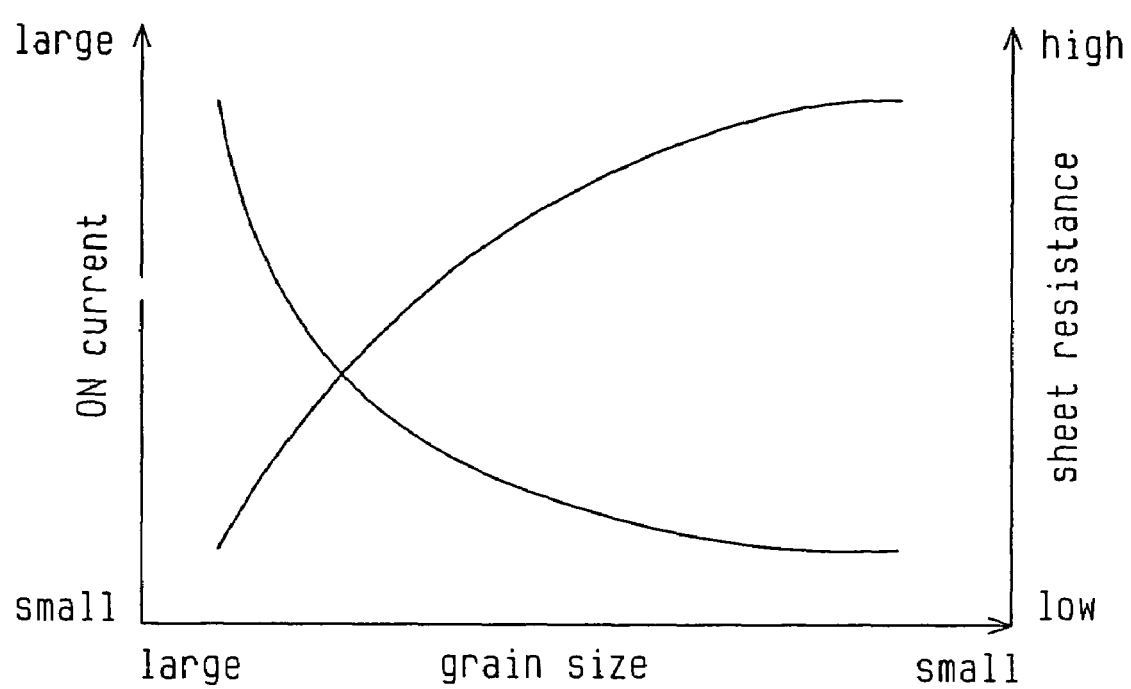
FIG. 4 is a graph showing a relationship between the grain sizes of the drain and source regions and the sheet resistances of both regions and a relationship between the grain size and the ON current of a TFT.
Figure 5:
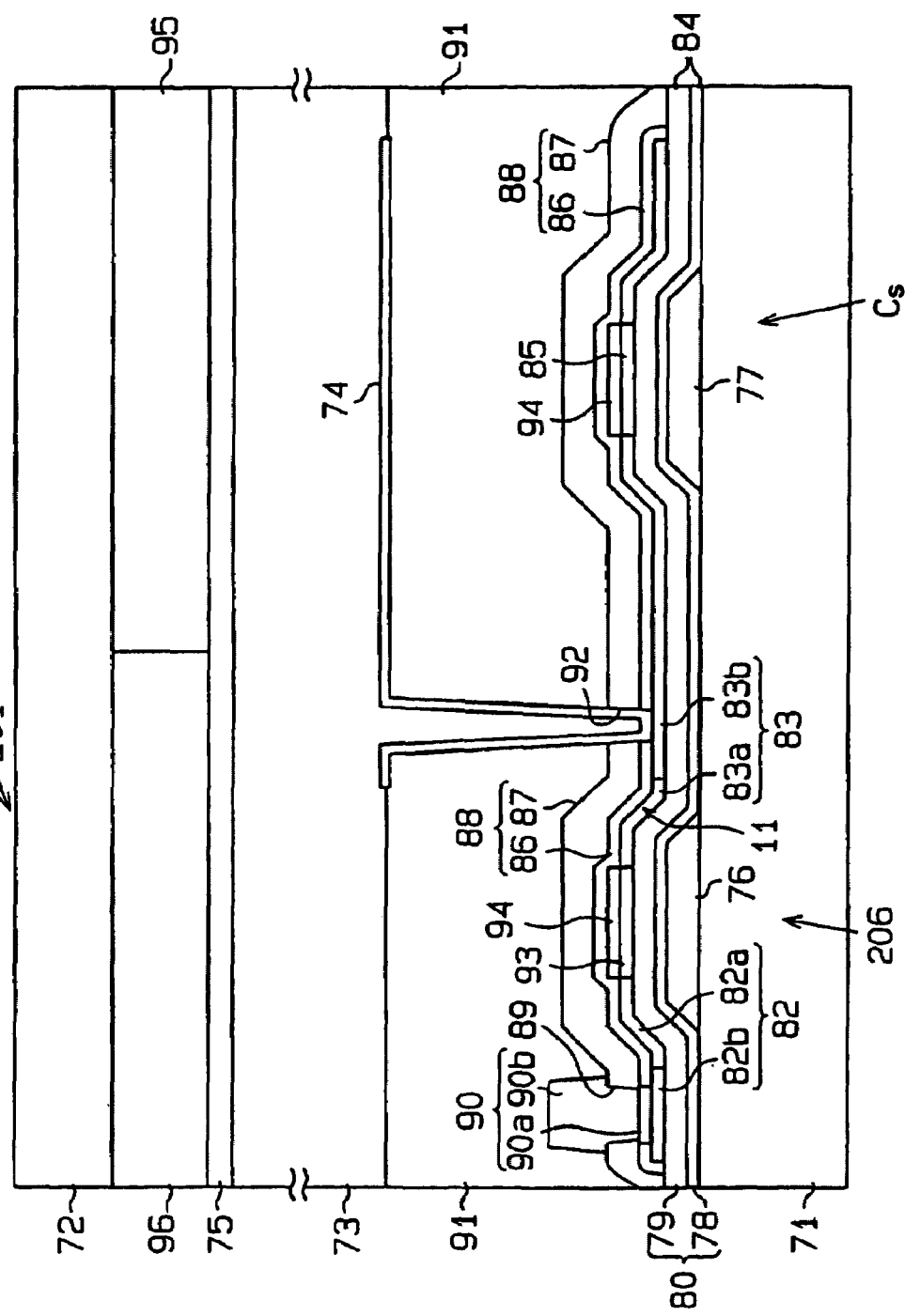
FIG. 5 is a cross-sectional view of a portion of an LCD display panel according to one embodiment of the present invention.
Figure 6A:
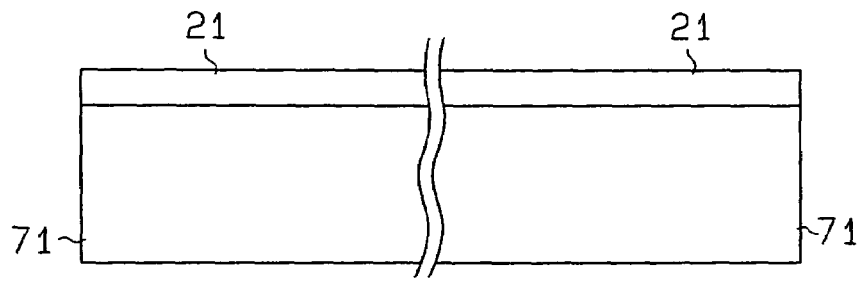
FIGS. 6A through 6D are cross-sectional views showing steps of manufacturing the LCD display panel of FIG. 5.
Figure 6B:
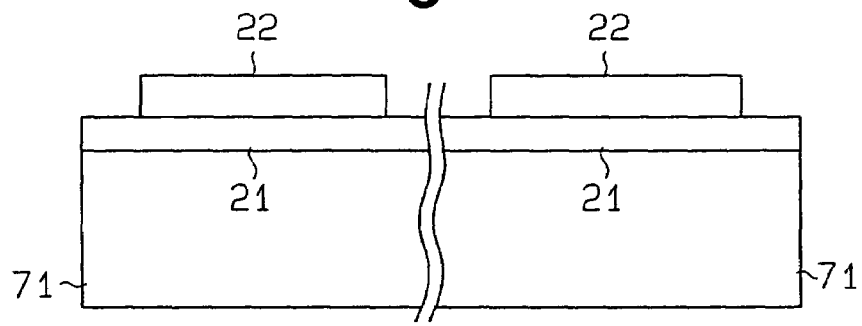
Figure 6C:
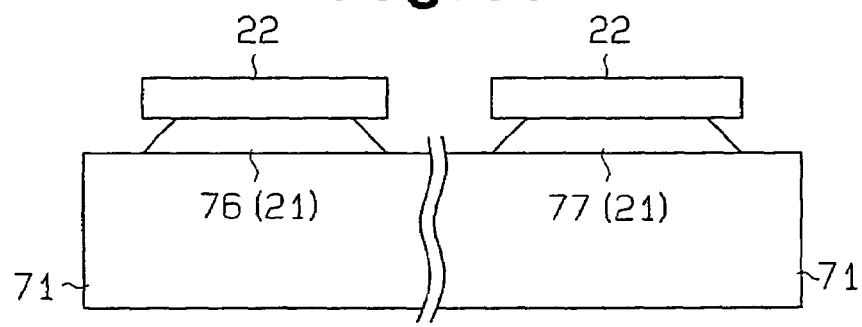
Figure 6D:
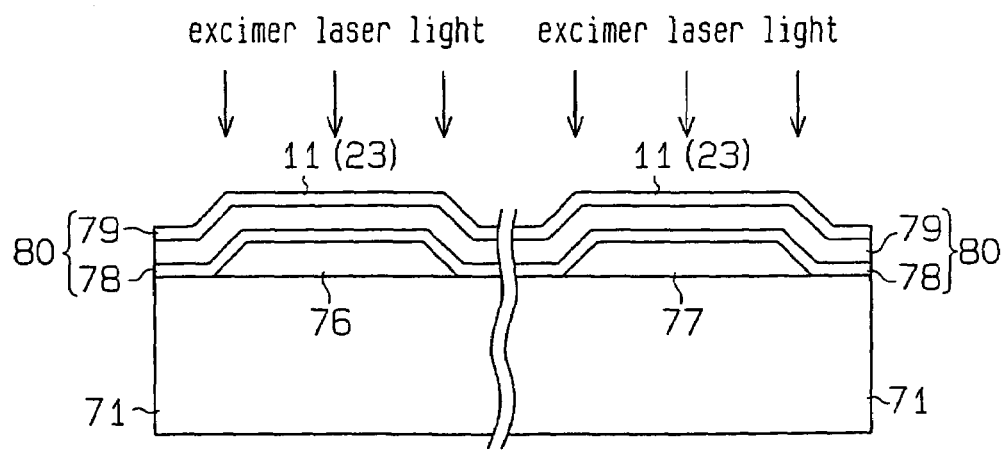

In the drawings, like numerals are used to refer to like elements. A display apparatus which has TFTs embodying the present invention will now be described with reference to the accompanying drawings. FIG. 5 is a schematic cross-sectional view of an LCD display panel 201 according to one embodiment of the present invention, which has polycrystalline silicon TFTs 206 having a bottom gate structure. The display panel 201 is assembled into an active matrix type LCD.

According to the present invention, the grain sizes of the drain and source regions 82 and 83, which are defined in a part of a polycrystalline silicon film 11 that forms the active layer of the TFT 206, are set greater than the grain size of a channel region 93 which is defined in another part of the polycrystalline silicon film 11. This setting reduces the sheet resistances of the drain and source regions 82 and 83 and the ON resistance of the channel region 93, as well., which prevents the ON current of the TFT 206 from dropping, and thus prevents a reduction in the yield of the display panel 201 and the occurrence of a display failure.

Referring particularly to FIG. 5, the display panel 201 has a pair of insulator substrates 71 and 72 facing each other, a liquid crystal (LC) layer 73 located between both of the insulator substrates 71, 72, and a flattening insulator film 91 located between the LC layer 73 and the insulator substrate 71. Both of the insulator substrates 71 and 72 are preferably transparent. A display electrode 74 of an LC cell LC is provided on the first surface of the LC layer 73 which faces the flattening insulator film 91. A common electrode 75 of the LC cell LC is provided on a second surface of the LC layer 73 which faces the insulator substrate 72.

The TFT 206 and a supplemental capacitor $C_S$ are arranged in parallel between the flattening insulator film 91 and the insulator substrate 71. The TFT 206 includes a gate electrode 76, a gate insulator film 80, the drain region 82, the source region 83, and the channel region 93 located between the drain region 82 and the source region 83. The TFT 206 is preferably formed into an LDD (Lightly Doped Drain) structure. The LDD structure increases the OFF resistance of the TFT 206 and improves the holding characteristic thereof. The gate electrode 76, positioned on the insulator substrate 71, forms a gate line Gn. The gate insulator film 80 includes a silicon nitride film 78, provided on the gate electrode 76 and the insulator substrate 71, and a silicon oxide film 79 provided on the silicon nitride film 78. The drain region 82, the source region 83 and the channel region 93 are defined in the polycrystalline silicon film 11 on the gate insulator film 80. Specifically, the channel region 93 is defined in a first portion of the polycrystalline silicon film 11 on the gate electrode 76. The source region 83 includes a low-concentration region 82a defined in a second portion of the polycrystalline silicon film 11 on the gate electrode 76 and a high-concentration region 82b defined in a third portion of the polycrystalline silicon film 11 above the insulator substrate 71. The source region 83 includes a low-concentration region 83a defined in a fourth portion of the polycrystalline silicon film 11 on the gate electrode 76 and a high-concentration region 83b defined in a fifth portion of the polycrystalline silicon film 11 above the insulator substrate 71.

The supplemental capacitor $C_S$ includes an opposing electrode 77, a dielectric film 84 and a storage electrode 85. The supplemental capacitor $C_S$ is formed in the same step as the TFT 206 is formed. The opposing electrode 77 and the gate electrode 76 are formed in the same step. The dielectric film 84, positioned on the opposing electrode 77, is formed integral with the gate insulator film 80. The storage electrode 85 is defined in the polycrystalline silicon film 11 located on the dielectric film 84, and is connected to the source region 83 of the TFT 206.

Stopper layers 94 are respectively provided on the channel region 93 and the storage electrode 85. The stopper layers 94 are preferably formed of silicon oxide. Provided on the TFT 206 and the supplemental capacitor $C_S$ is an interlayer insulator film 88 which includes a first silicon oxide film 86 and a second silicon nitride film 87.

The high-concentration region 82b of the drain region 82 is connected to a drain electrode 90 via a contact hole 89 formed in the interlayer insulator film 88. The drain electrode 90 includes a molybdenum layer 90a located on the high-concentration region 82b and an aluminum alloy layer 90b located on the molybdenum layer 90a, and forms a drain line Dn. The high-concentration region 83b of the source region 83 is connected to the display electrode 74 via a contact hole 92 formed in the flattening insulator film 91 and the interlayer insulator film 88. The display electrode 74 is preferably formed of ITO (Indium Tin Oxide).

A color filter 95 and a black matrix 96 are arranged in parallel between the common electrode 75 and the insulator substrate 72. The color filter 95 preferably includes three color filters corresponding to the three primary colors of red, green and blue (RGB). The black matrix 96 is located between the color filters 95 and serves as a light-shielding film. It is preferable that the color filter 95 is provided above the display electrode 74 and the black matrix 96 is provided above the TFT 206.

The step of manufacturing the LCD display panel will now be discussed with reference to FIGS. 6A through 6D.

Step 1 (see FIG. 6A): A chromium film 21 is formed on the insulator substrate 71 by preferably sputtering.

Step 2 (see FIG. 6B): A resist pattern 22 for forming the gate electrode 76 and the opposing electrode 77 is formed on the chromium film 21.

Step 3 (see FIG. 6C): With the resist pattern 22 used as an etching mask, the chromium film 21 is etched by wet etching to form the gate electrode 76 and the opposing electrode 77. The gate electrode 76 and the opposing electrode 77 may be formed of a single film of a high-melting point metal, such as molybdenum, tungsten, tantalum, hafnium, zirconium, niobium, titanium, vanadium, rhenium, iridium, osmium or rhodium, a film of a high-melting point metal alloy, or multiple layers of high-melting point metal films.

Step 4 (see FIG. 6D): The silicon nitride film 78, the silicon oxide film 79 and an amorphous silicon film 23 are formed, in order, on the gate and opposing electrodes 76 and 77 and the insulator substrate 71. The silicon nitride film 78 and the silicon oxide film 79 form the gate insulator film 80. The gate insulator film 80 and the amorphous silicon film 23 form a device structure.

Next, the device is annealed at 400° C. to remove hydrogen from the amorphous silicon film 23 (dehydration).

Then, using ELA, excimer laser light (XeCl, KrF, ArF, etc.) is irradiated on the surface of the amorphous silicon film 23 to heat the film 23. This crystallizes the amorphous silicon film 23, forming the polycrystalline silicon film 11. It is preferable to irradiate pulses of the excimer laser light in the form of a line beam. Further, the preferable irradiation area of the laser beam is about 150×0.3 mm. The scanning of the laser beam is carried out so that the laser beam is irradiated on the entire surface of the amorphous silicon film 23. According to the present invention, the ELA laser energy is set such that the grain sizes of the drain and source regions 82 and 83 defined in the polycrystalline silicon film 11 are greater than the grain size of the channel region 93.

Thereafter, the drain region 82 and the source region 83 are defined in the polycrystalline silicon film 11, and the individual members illustrated in FIG. 5 are formed, thus completing the display panel 201. In the step 4, hydrogenation treatment to bond hydrogen atoms is performed on the crystal defects of the polycrystalline silicon film 11. This reduces defects to stabilize the crystal structure, enhances the field effect mobility and improves the device characteristic of the TFT 206. Further, an impurity may be doped into the channel region 93 to control the threshold voltage ($V_{th}$) of the TFT 206.

In polycrystalline silicon TFTs, the threshold voltage of an n-channel transistor tends to shift in the depletion direction, while the threshold voltage of a p-channel transistor tends to shift in the enhancement direction. When a hydrogenation treatment is performed, particularly, this tendency becomes more prominent. The doping of an impurity in the channel region suppresses the shifting of the threshold voltage.

Figure 7:
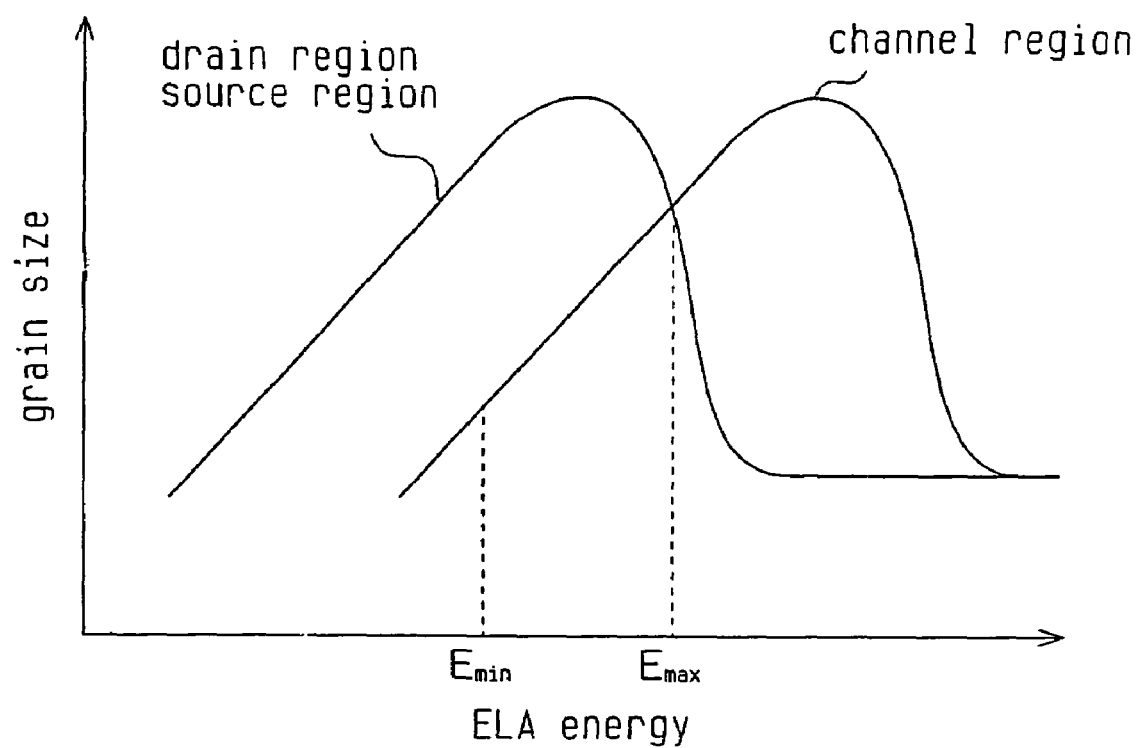
FIG. 7 is a graph showing a relationship among the grain sizes of the drain and source regions, the grain size of the channel region and laser energy of the LCD display panel of FIG. 5.

FIG. 7 is a graph showing a relationship among the grain sizes of the drain and source regions 82 and 83, and the grain size of the channel region 93 and the laser energy. When the ELA laser energy is relatively low, the grain sizes of the drain and source regions 82 and 83 become peaks. When the ELA laser energy is relatively high, on the other hand, the grain size of the channel region 93 becomes a peak. The reason for the phenomenon is because the gate electrode 76 is comprised of the chromium film 21 having a high thermal conductivity. That is, the heat energy of the laser beam irradiated on the amorphous silicon film 23 on the gate electrode 76 is absorbed by the gate electrode 76, and is transmitted via the associated one of the gate lines G1 to Gn to be diffused.

According to the present invention, optimization is performed on the setting of the ELA energy. Specifically, the ELA laser energy is preferably set between a minimum value $E_{min}$ and a maximum value $E_{max}$. The maximum value $E_{max}$ is the value of the ELA laser energy which makes the grain sizes of the drain and source regions 82 and 83 become substantially the same as the grain size of the channel region 93. The minimum value $E_{min}$ is the value of the ELA laser energy which sets the grain size of the channel region 93 to a minimum essential (about 500 Å). The maximum value $E_{max}$ and the minimum value $E_{min}$ can be acquired empirically. To provide a satisfactory device characteristic of the TFT 206, the grain size of the channel region 93 is preferably about 500 Å to 20000 Å, more preferably about 1500 Å to 20000 Å, and optimally 3000 Å to 10000 Å. When the grain size lies outside these ranges, the throughput in the fabrication process is degraded and the number of crystalline cores of the channel region 93 becomes equal to about 20 or smaller, which further causes a variation in devices. Furthermore, the ON current of the TFT 206 drops. Such simple optimization of the ELA laser energy provides the drain and source regions 82 and 83 which have the desired grain sizes.

It should be apparent to those skilled in the art that the present invention may be embodied in many other specific forms without departing from the spirit or scope of the invention. For example, the present invention may be adapted to a TFT which has an SD (Single Drain) structure or a double gate structure. The present invention may be adapted to a close-contact type image sensor or three-dimensional IC by replacing the insulator substrate 71 with a ceramic substrate or an insulator layer like a silicon oxide film. The TFT of the present invention may be used for a pixel drive element in an active matrix type display apparatus which uses electroluminescence elements as pixels.

Therefore, the present examples and embodiment are to be considered as illustrative and not restrictive and the invention is not to be limited to the details given herein, but may be modified within the scope and equivalence of the appended claims.

What is claimed is:

1. A method of fabricating a thin film transistor comprising the steps of:
    forming a gate electrode on an insulator substrate;
    forming a gate insulator film over the insulator substrate and the gate electrode;
    forming an amorphous silicon film on the gate insulator film;
    irradiating laser light on a surface of the amorphous silicon film to heat the amorphous silicon film, thereby forming a polycrystalline silicon film;
    setting energy of the laser light such that a grain size of a first portion of the polycrystalline silicon film over the insulator substrate becomes equal to or greater than a grain size of a second portion of the polycrystalline silicon film over the gate electrode; and
    defining a source and a drain of the thin film transistor in the first portion and defining a channel of the thin film transistor in the second portion, wherein the step of setting the energy of the laser light includes the steps of:
    setting a maximum energy of the laser light such that grain sizes of the drain and the source become substantially equal to a grain size of the channel; and
    setting a minimum energy of the laser light to obtain a grain size of the channel enough to provide a desired device characteristic of the thin film transistor.

2. The method according to claim 1, wherein the grain size of the channel which is enough to provide the desired device characteristic of the thin film transistor lies in a range of about 500 Å to about 20000 Å.

3. The method according to claim 1, wherein the grain size of the channel which is enough to provide the desired device characteristic of the thin film transistor lies in a range of about 1500 Å to about 20000 Å.

4. The method according to claim 1, wherein the grain size of the channel which is enough to provide the desired device characteristic of the thin film transistor lies in a range of about 3000 Å to about 10000 Å.

* * * * *

UNITED STATES PATENT AND TRADEMARK OFFICE
CERTIFICATE OF CORRECTION

PATENT NO. : 7,033,872 B2  
APPLICATION NO. : 10/884500  
DATED : April 25, 2006  
INVENTOR(S) : Yushi Jinno, Ken Wakita and Masahiro Minegishi Page 1 of 1

It is certified that error appears in the above-identified patent and that said Letters Patent is hereby corrected as shown below:

On the title page item [73], should read

Sanyo Electric Co., Ltd.  Osaka, Japan  
Sony Corporation        Tokyo, Japan

Signed and Sealed this

Twenty-second Day of August, 2006

JON W. DUDAS  
*Director of the United States Patent and Trademark Office*